United States Patent [19]

Waller et al.

[11] Patent Number: 4,912,665

[45] Date of Patent: Mar. 27, 1990

[54] ARITHMETIC LOGIC UNIT CAPABLE OF HAVING A NARROW PITCH

[75] Inventors: William K. Waller; Mirmajid Seyyedy, both of Boise; Thomas E. Nichols, Meridian, all of Id.

[73] Assignee: Micron Technology, Inc., Boise, Id.

[21] Appl. No.: 325,699

[22] Filed: Mar. 13, 1989

[51] Int. Cl.⁴ .............................................. G06F 7/38
[52] U.S. Cl. ................................................. 364/716
[58] Field of Search ... 364/716, 784, 786, 200 MS File; 307/445, 448, 451, 465

[56] References Cited

U.S. PATENT DOCUMENTS

| | | | |
|---|---|---|---|
| 3,767,906 | 10/1973 | Pryor | 364/786 |
| 4,349,888 | 9/1982 | Smith | 364/716 |
| 4,417,314 | 11/1983 | Best | 364/716 |
| 4,541,067 | 9/1985 | Whitaker | 364/716 |
| 4,620,117 | 10/1986 | Fang | 307/451 |
| 4,622,648 | 11/1986 | Whitaker | 364/784 |
| 4,752,901 | 6/1988 | Vaughn | 364/716 |
| 4,797,808 | 1/1989 | Bellay et al. | 364/200 |

Primary Examiner—Gary V. Harkcom
Assistant Examiner—Long T. Nguyen
Attorney, Agent, or Firm—Jon Paul Busack; Stan N. Protigal; Angus C. Fox, III

[57] ABSTRACT

An arithmetic logic unit (ALU) cell, having a narrow pitch for straightforward cascading and integration with a memory array or similar device, also able to efficiently perform AND, NAND, OR, NOR, XOR, XNOR, INVERT, SET and CLEAR operations, and ripple carry addition. The ALU has particular utility in a multiport random access memory (RAM) based multiprocessor.

9 Claims, 5 Drawing Sheets

| A | B | CIN | S | COUT |
|---|---|-----|---|------|
| 0 | 0 | 0   | 0 | 0    |
| 0 | 1 | 0   | 1 | 0    |
| 1 | 0 | 0   | 1 | 0    |
| 1 | 1 | 0   | 0 | 1    |
| 0 | 0 | 1   | 1 | 0    |
| 0 | 1 | 1   | 0 | 1    |
| 1 | 0 | 1   | 0 | 1    |
| 1 | 1 | 1   | 1 | 1    |

FIG. 4

ARITHMETIC LOGIC UNIT CAPABLE OF HAVING A NARROW PITCH

FIELD OF THE INVENTION

This invention generally relates to CMOS arithmetic logic unit (ALU) design, and more precisely relates to a narrow ALU cell that can be easily cascaded and connected in parallel to bit lines of an integrated memory array circuit, without expanding pitch of said array.

BACKGROUND OF THE INVENTION

A multiprocessor, disclosed in application "Multiport RAM Based Multiprocessor," inventor Ward D. Parkinson et al, file date Mar. 9, 1989, here incorporated by reference, requires a narrow ALU cell for efficient integration. To make the multiprocessor as small as possible (which is highly desirable), each ALU cell can be no wider than one or two bit lines in the RAM array.

The present invention includes a narrow ALU cell design useful for the above application.

SUMMARY OF THE INVENTION

A preferred embodiment of the invention includes an ALU cell having a narrow pitch, so that a cascade of such ALU cells can be connected in parallel to bit lines of a memory array. The preferred embodiment performs AND, NAND, OR, NOR, XOR, XNOR, INVERT, SET, CLEAR, and ripple carry addition. Multiplication and other functions can be performed by sequentially stepping the ALU through one or more of its operations.

Because The preferred embodiment includes simple transistor circuitry, fast operation times are possible.

The inventive ALU cell has a small enough pitch such that a plurality of them can be cascaded and integrated with a memory array or similar device, making possible a memory based microprocessor, while retaining the small bit line pitch of said array.

Such an ALU cell allows on-chip processing, thus eliminating a data transfer bottleneck between memory and the ALU cell.

A plurality of primary logic operations are simultaneously generated, therefore having equal processing times. These primary operations are invertible, said inversion adding approximately one gate delay. These primary operations include operations required for ripple carry addition, so that a sum bit and a carry bit are generated nearly simultaneously, thus increasing ripple carry addition speed.

BRIEF DESCRIPTION OF THE DRAWINGS

FIG. 4 contains a table detailing ripple carry addition.

DETAILED DESCRIPTION OF THE PREFERRED EMBODIMENT

Figure 1:
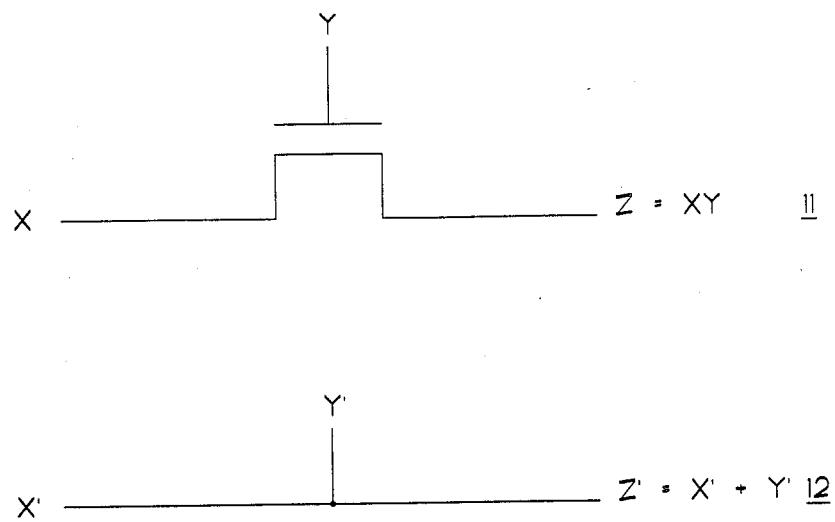
FIG. 1 shows simple implementations of AND and OR operation.

As shown in FIG. 1, logic operations AND and OR may be accomplished by simple circuits 11 and 12. Circuit 11 is a field effect transistor (FET) or equivalent device, with inputs X and Y, and output Z, the output Z and one of the inputs (here shown as X) each on an active electrode of the FET 11. If X, Y, and Z are limited to logic high or low levels (also called 1 and 0), it is evident that Z is high only when both X and Y are high. This is an AND operation. Circuit 12 is commonly referred to as a wire OR. If Z', Y', or both are active (said active state can be high or low), the Z' is in an active state. A necessary wire OR condition is that if an input is not active, then it must be disconnected (high impedance), or very weakly biased. Unless otherwise noted, all arithmetic expressions herein represent Boolean logic. For example, "+" denotes an OR operation, not addition.

Figure 2:
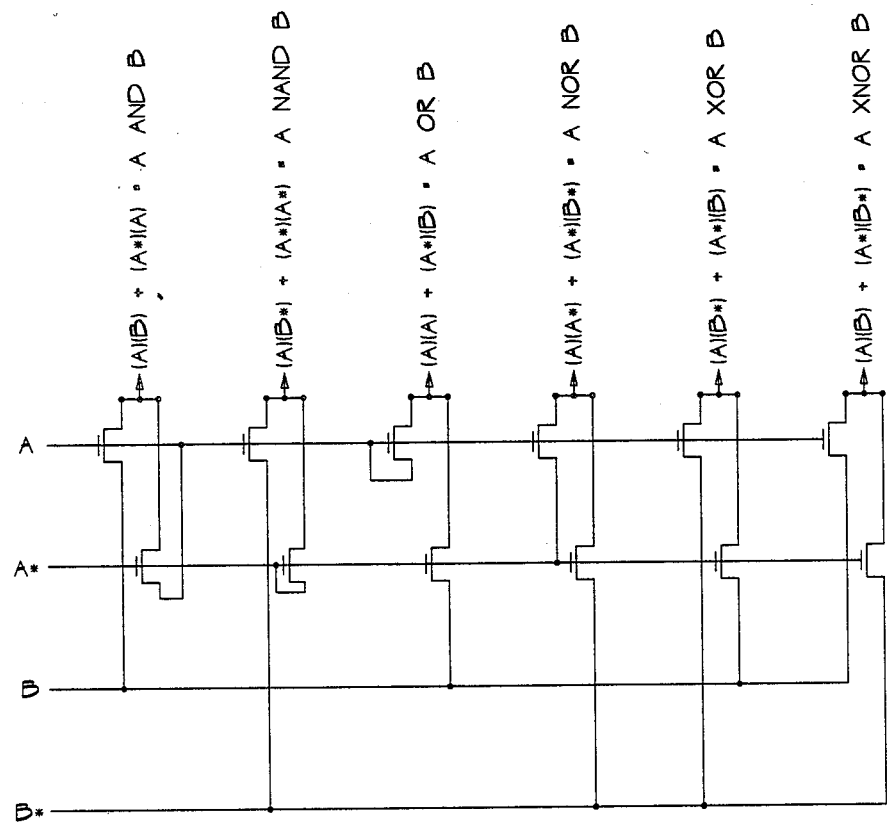
FIG. 2 shows AND, NAND, OR, NOR, XOR, and XNOR implementations.

Following these concepts, AND, NAND, OR, NOR, XOR, and XNOR operations each can be implemented as shown in FIG. 2. Notice that each implementation includes two FETs of the same conductive type, input A controlling one, and input A* controlling the other, so that an output node is driven high or low by only one activated FET at a time, the other FET being deactivated (off).

Figure 3:
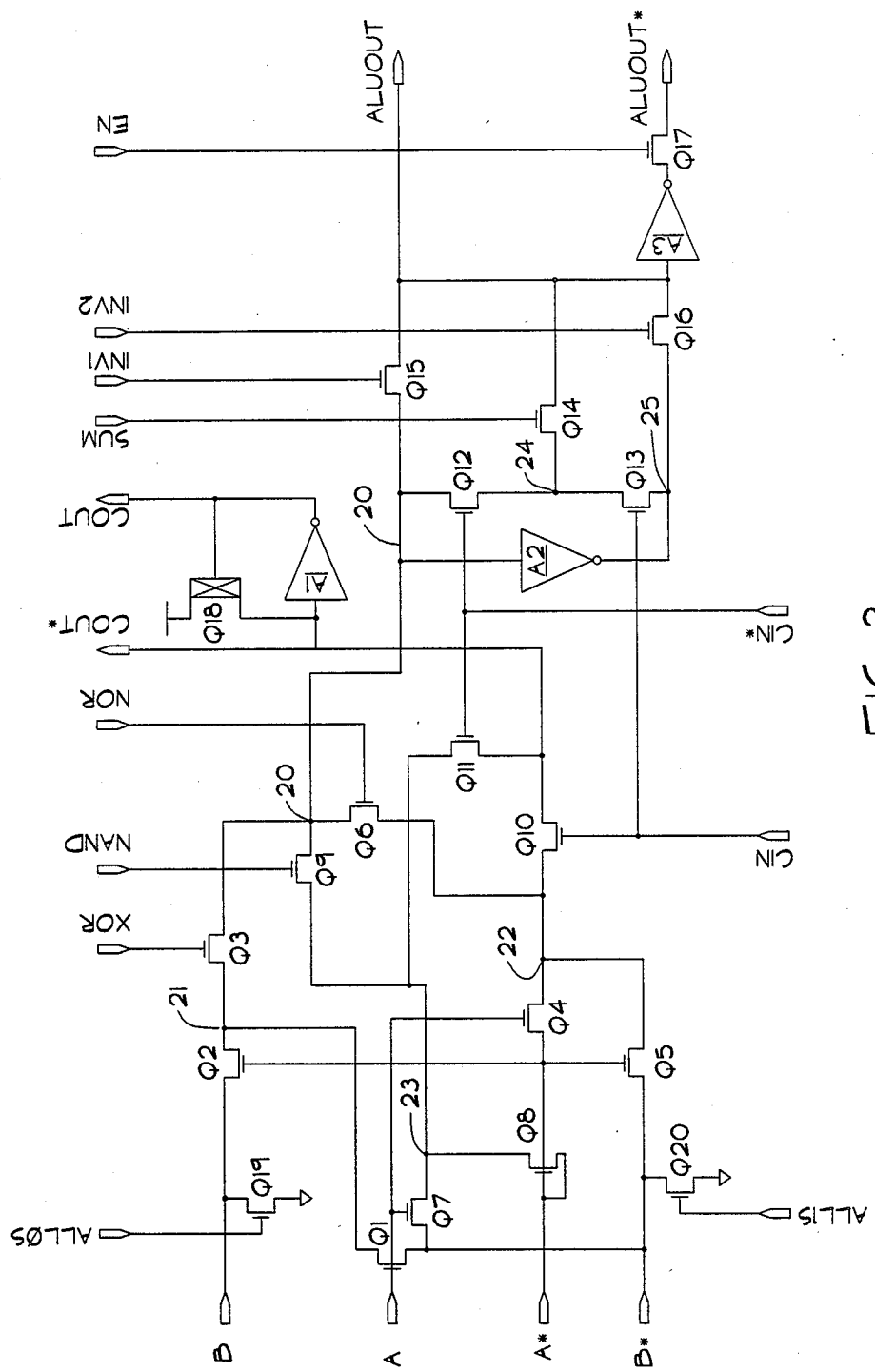
FIG. 3 shows a schematic of a preferred embodiment of the invention.

Of these implementations, XOR, NAND, and NOR are used with advantage to create a narrow pitch ALU cell, shown in FIG. 3. Transistors Q1–Q20 and inverters A1–A3 are connected as shown. Q1–Q17 and Q19–Q20 are n-channel, and Q18 is p-channel. Nodes A, A*, B, B*, CIN, and CIN* are data inputs, "*" denoting inversion. Nodes ALL0S, ALL1s, XOR, NAND, NOR, SUM, INV1, INV2, and EN are control inputs. Only one node of nodes XOR, NAND, and NOR is held high at one time. Only one node of nodes SUM, INV1, and INV2 is held high at one time. Nodes ALUOUT and ALUOUT* are data outputs. EN high enables the ALUOUT* output. ALL0S and ALL1S are normally held low.

Figure 5:
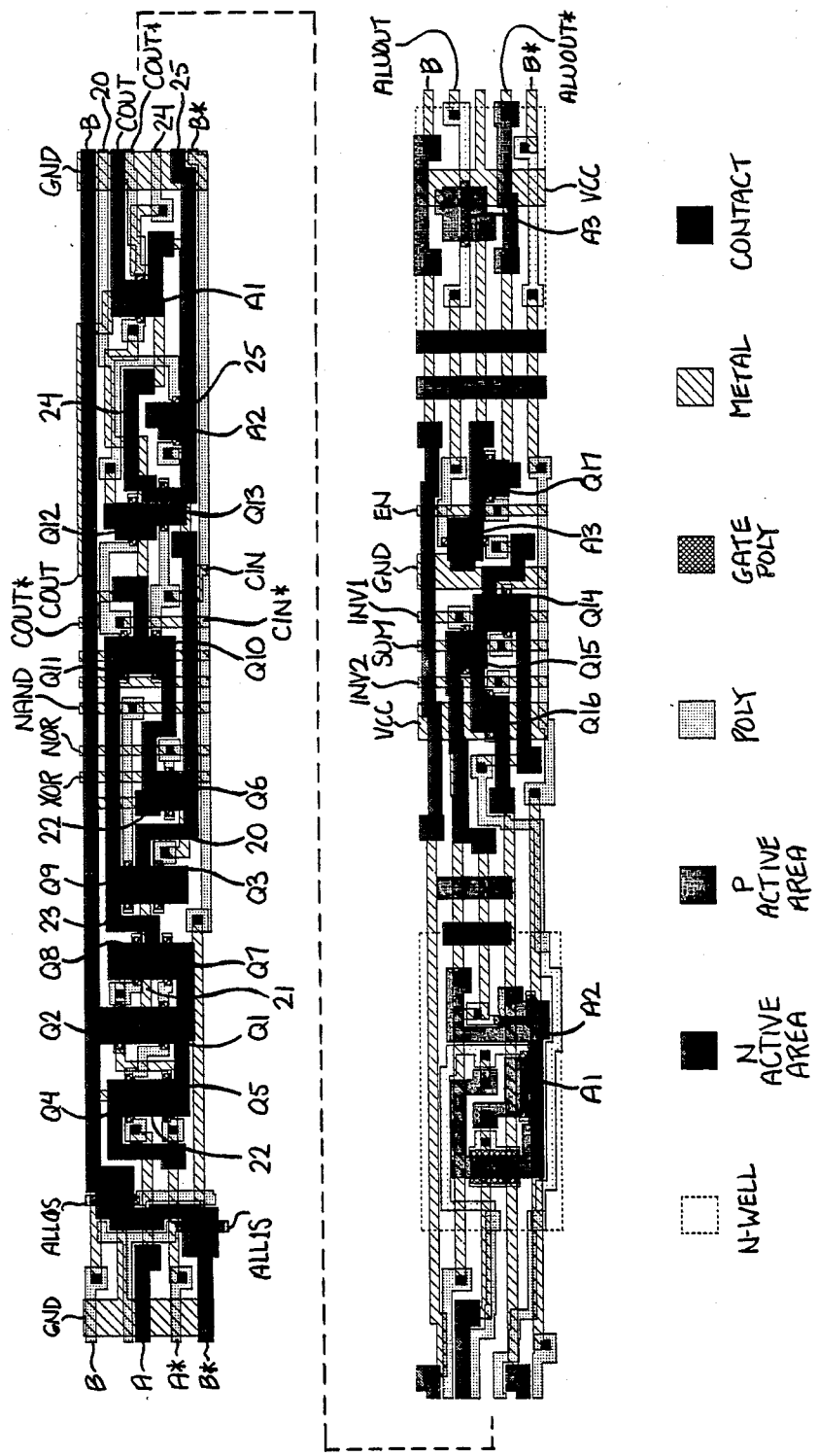
FIG. 5 shows a layout of the preferred embodiment.

A layout corresponding to the preferred embodiment is shown in FIG. 5.

The preferred embodiment pitch is about twice the bit line pitch of a dynamic random access memory (DRAM) array. The preferred embodiment can be easily integrated with said array by alternating bit lines, odd bit lines connecting to ALU cells on one side of the array, and even bit lines connecting to ALU cells on an opposing side. It should be noted that other arrangements may be made with the equivalent effect, such as alternating every two bit lines instead of every one. If the array pitch is wide enough, such as with a static random access memory (SRAM) or other larger pitched array, cascaded ALU cells may be integrated along one side of the array. It should also be noted that an ALU cell or a cascade of ALU cells may be integrated with a device that is not a memory array.

A XOR B Is equivalent to (A)(B*)+(A*)(B). As shown in FIG. 3, Q1 embodies term (A)(B*), and Q2 embodies term (A*)(B). The terms are wired ORed at node 21. When node XOR is high, A XOR B (the value of node 21) passes through Q3 to node 20. Notice that by using A in one term and A* in the other, only one term drives wire OR 21 at a time, the non-driving term being hi-Z. This technique is used for all wire ORs in the preferred embodiment.

A NOR B is equivalent to (A)(A*)+(A*)(B*). Q4 embodies term (A)(A*), and Q5 embodies (A*)(B*). The terms are wire ORed at node 22. When node NOR is high, A NOR B (the value of node 22) passes through Q6 to node 20.

A NAND B is equivalent to (A)(B*)+(A*)(A*). Q7 embodies term (A)(B*), and Q8 embodies term (A*)(A*). The terms are wire ORed at node 23. When node NAND is high, A NAND B (the value of node 23) passes through Q9 to node 20.

Ripple carry addition in the preferred embodiment is now disclosed, looking first at carry-out generation, then at sum generation. As shown in the Table of FIG. 4, when a carry-in bit CIN is low, a carry-out bit COUT can be generated by operation A AND B. When CIN is high, COUT can be generated by operation A OR B. In the preferred embodiment, when input CIN is high, Q10 passes inverted carry-out bit A NOR B from node 22 to output COUT*. When input CIN is low, input CIN* is high, allowing Q11 to pass inverted carry-out bit A NAND B from node 23 to output COUT*. Inverter A1 with helper pullup Q18 generates COUT from COUT*. Q18 pulls up COUT* to a full rail level, so the carry bit voltage does not degenerate as it is rippled through cascaded ALU cells. Q18 also reduces power required by inverter A1.

Also as shown in the table of FIG. 4, a sum bit S can be generated by a parity function of the bits A, B, and CIN. This can be implanted with the function A XOR B XOR CIN. During an addition in the preferred embodiment, node XOR is held high, allowing Q3 to pass A XOR B from node 21 to node 20. Inverter A2 inverts A XOR B and places it on node 25. Q12 and Q13, controlled by CIN* and CIN respectively, then perform (A XOR B) XOR CIN, placing the result on node 24. When node SUM Is high, the value of node 24 (the sum of bits A, B, and CIN) is passed to node ALUOUT.

When no sum or inversion is desired, control signal INV12 is held high. This allows the signal on node 20 to pass directly to output ALUOUT. Inversion is accomplished by holding INV2 high instead of INV1. This allows the signal on node 25 (which is inverse to node 20) to pass to output ALUOUT. This inversion, when used with primary operations XOR, NAND, and NOR operations already described, allows generation of XNOR, AND, and OR operations. In each case, the final signal (whether from node 20 or node 25), is also presented to inverter A3, which generates output ALUOUT*. ALUOUT* is desirable when the ALU cell drives a device with differential inputs. Otherwise, ALUOUT*, A3, Q17 and EN may be be necessary.

The preferred embodiment can INVERT A in a plurality of ways. One way is to use the fact that if B* is high for A NOR B=(A)(A*)+(A*)(B*), then A NOR B=A*. In the preferred embodiment, B and B* are switchably connected to bit lines in a memory array, which are precharged high during an access cycle (B and B* both high being a null state). Because B* is precharged high, INVERT A can be performed by isolating precharged B and B* from the array (to preserve the precharge), and pulling node NOR high, allowing Q6 to pass inverted A to node 20. Pulling INV1 high then allows inverted A to pass to node ALUOUT through Q15.

A second way to perform INVERT A is to pull precharged node B* low by activating Q20 via node ALL1S, then pulling node XOR high. This essentially performs A XOR 1, which inverts A. Pulling INV1 high then allows inverted A to pass to node ALUOUT.

A third way to perform INVERT A is to pull precharged node B low by activating Q19 via node ALL0S, then pulling node XOR high. This essentially performs A XOR 0, which passes A through Q3 uninverted to node 20. Pulling node INV2 high then inverts A and places it on node ALUOUT.

The preferred embodiment also performs SET on B and B*. If B and B* are precharged high (null state), then activating node ALL1S pulls B* down through Q20, giving the result of B=1 and B*=0, setting B. CLEAR is performed by activating ALL0S on precharged B and B*, pulling B down through Q19, giving the result of B=0 and B*=1, thus clearing B.

Any logic operation such as AND, NAND, OR, NOR, XOR, and XNOR can be selected as a primary logic operation of the inventive ALU cell. XOR, NAND, and NOR were chosen as primary operation because NAND and NOR are useful for efficiently generating bit COUT*, and XOR is useful for directly generating a sum bit on node 24. AND, OR, and XNOR can then be generated simply by inverting the chosen primary operations.

The reason for generating COUT* and then inverting COUT* to get COUT, rather than generating COUT and the inverting COUT to get COUT*, will now be disclosed. A carry-out bit such as COUT remains low, or has a low to high transition, then staying high. The output of an n-channel FET has a faster high to low transition than low to high. Therefore, for faster overall ripple carry (carry-out generation) using n-channel devices, COUT* (having a high to low transition, if any transition at all) is generated. During an addition, if the carry bit is unchanged, no transition time is necessary and there is no ripple carry delay. If the carry bit undergoes a transition, the circuit is configured to most quickly process the transition. Equivalently, for faster ripple carry using p-channel elements, COUT should be generated and then inverted to obtain COUT*, However, it is well known that n-channel technology is faster than, and therefore preferably to, p-channel technology. The preferred embodiment provides a ripple carry propagation time of one gate delay or less per ALU cell.

Although the preferred embodiment includes primary operations XOR, NAND, and NOR, more, fewer, or other operations or functions might also be selected. Simply a pass-through function might be implemented. It should also be understood that this invention can be embodied using p-channel FETs, in a similar fashion as with n-channel FETs. Conceivably, any type of switching device that is appropriate to the application at hand. Although the preferred embodiment uses CMOS technology, other technologies might be chosen. Any of these variations may be made while remaining within the scope of this invention.

We claim:

1. An ALU cell, comprising:
   (a) a plurality of logic operation means, including exclusive OR, NAND, NOR, SET, and CLEAR;
   (b) first selection means to pass an output of a selected one of said plurality of logic operation means to a first node;
   (c) means to invert a signal on said first node and pass the inverted signal to a second node; and
   (d) second selection means to pass a signal on one of said first and second nodes to a first output node; WHEREIN said ALU cell has a narrow pitch.

2. The ALU of claim 1, further comprising:
   (a) a carry-in input;
   (b) third selection means, to pass an output of said NOR logic operation means to a second output node when said carry-in input is in a first state, and to pass an output of said NAND logic operation means to said second output node when said carry-in input is in a second state; and (c) second exclusive OR logic operation means, using said carry-in input and said first node as inputs, said second exclusive OR logic operation means outputting to a sum node;

WHEREIN said second selection means is able to pass a signal on one of the first, second, and sum nodes to said first output node.

3. The ALU cell of claim 1, wherein said narrow pitch is approximately twice a DRAM bitline pitch.

4. An ALU cell, comprising:
(a) first switching means, controllable by a first signal, and second switching means, controllable by a second signal in a same sense as said first switching means is controllable by said first signal;
(b) third switching means;
(c) fourth switching means, controllable by said first signal, and fifth switching means, controllable by said second signal in a same sense as said fourth switching means is controllable by said first signal;
(d) sixth switching means;
(e) seventh switching means, controllable by said first signal, and eighth switching means, controllable by said second signal in a same sense as said seventh switching means is controllable by said first signal;
(f) ninth switching means;
(g) said first switching means providing a switchable path between a fourth signal and a first node, said second switching means providing a switchable path between a third signal and said first node, said third switching means providing a switchable path between said first node and a second node;
(h) said fourth switching means providing a switchable path between said second signal and a third node, said fifth switching means providing a switchable path between said fourth signal and said third node, said sixth switching means providing a switchable path between said third node and said second node;
(i) said seventh switching means providing a switchable path between said fourth signal and a fourth node, said eighth switching means providing a switchable path between said second signal and said fourth node, said ninth switching means providing a switchable path between said fourth node and said second node;
(j) first inversion means, to invert a signal on said second node and pass it to a fifth node;
(k) tenth switching means, configured to pass a signal from said second node to a first output node; and
(l) eleventh switching means, configured to pass a signal from said fifth node to said first output node;

WHEREIN said ALU cell has a narrow pitch.

5. The ALU of claim 4, further comprising:
(a) twelfth switching means, controllable by a carry-in signal, and thirteenth switching means, controllable by an inversion of said carry-in signal in the same sense as said twelfth switching means is controllable by said carry-in signal, said twelfth switching means to pass a signal from said third node to a second output node, said thirteenth switching means to pass a signal from said fourth node to said second output node;
(b) fourteenth switching means, controllable by side carry-in signal, and fifteenth switching means, controllable by an inversion of said carry-in signal in the same sense as said fourteenth switching means is controllable by said carry-in signal, said fourteenth switching means to pass a signal from said fifth node to a sum node, said fifteenth switching means to pass a signal from said second node to said sum node;
(c) sixteenth switching means, to pass a signal from said sum node to said first output node.

6. The ALU cell of claim 5, further comprising:
(a) seventeenth switching means, providing a switchable path between said third signal and a reference node; and
(b) eighteenth switching means, providing a switchable path between said fourth signal and said reference node.

7. The ALU cell of claim 6, further comprising:
second inversion means, to invert a signal on said second output node and pass it to a third output node, said inversion means substantially providing full rail signal levels.

8. The ALU cell of claim 6, further comprising:
third inversion means, to invert a signal on said first output node and pass it to a fourth output node.

9. The ALU cell of claim 4, wherein said narrow pitch is approximately twice a DRAM bitline pitch.

* * * * *